United States Patent
Denk

(10) Patent No.: US 9,945,315 B2
(45) Date of Patent: Apr. 17, 2018

(54) METHOD AND DEVICE FOR DETERMINING A REFERENCE CURRENT PROGRESSION FOR A FUEL INJECTOR, FOR DETERMINING THE INSTANT OF A PREDETERMINED OPENING STATE OF THE FUEL INJECTOR

(71) Applicant: Continental Automotive GmbH, Hannover (DE)

(72) Inventor: Frank Denk, Obertraubling (DE)

(73) Assignee: CONTINENTAL AUTOMOTIVE GMBH, Hannover (DE)

( * ) Notice: Subject to any disclaimer, the term of this patent is extended or adjusted under 35 U.S.C. 154(b) by 146 days.

(21) Appl. No.: 14/787,513

(22) PCT Filed: Apr. 23, 2014

(86) PCT No.: PCT/EP2014/058181
§ 371 (c)(1),
(2) Date: Oct. 28, 2015

(87) PCT Pub. No.: WO2014/177431
PCT Pub. Date: Nov. 6, 2014

(65) Prior Publication Data
US 2016/0102628 A1    Apr. 14, 2016

(30) Foreign Application Priority Data
Apr. 29, 2013 (DE) .................. 10 2013 207 842

(51) Int. Cl.
F02D 41/24    (2006.01)
F02D 41/20    (2006.01)
(Continued)

(52) U.S. Cl.
CPC ......... *F02D 41/2467* (2013.01); *F02D 41/20* (2013.01); *G01R 19/0092* (2013.01);
(Continued)

(58) Field of Classification Search
CPC .. F02M 61/12; F02M 51/0653; F02M 63/001; F02M 47/025; F02M 51/0675;
(Continued)

(56) References Cited

U.S. PATENT DOCUMENTS 6,949,923 B2   9/2005  Schultz et al. ........... 324/207.18
8,887,560 B2   11/2014  Beer et al. .................. 73/11.49
(Continued)

FOREIGN PATENT DOCUMENTS

CN   102959218 A   3/2013   ............. F02D 41/20
DE   10150199 A1   4/2003   ............... H01F 7/18
(Continued)

OTHER PUBLICATIONS

German Office Action, Application No. 102013207842.0, 5 pages, dated Feb. 26, 2014.
(Continued)

*Primary Examiner* — Hung Q Nguyen
*Assistant Examiner* — Xiao Mo
(74) *Attorney, Agent, or Firm* — Slayden Grubert Beard PLLC

(57) ABSTRACT

A method for determining a reference current curve for a fuel injector having a magnetic coil drive in an internal combustion engine of a motor vehicle includes: (a) applying a first voltage pulse to the magnetic coil drive to open the fuel injector, (b) applying a holding voltage to the magnetic coil drive to hold the fuel injector open, (c) switching off the holding voltage, (d) waiting for substantially no current to flow through the magnetic coil drive for a predetermined time period that is sufficiently short that the fuel injector remains open, (e) applying a second voltage pulse to the magnetic coil drive, and (f) recording a time-based curve of the current that flows through the magnetic coil drive during the second voltage pulse, which forms the reference current curve. This reference current curve is used for determining a time of a predetermined opening state of the fuel injector.

12 Claims, 2 Drawing Sheets

(51) Int. Cl.
    *H01F 7/18*        (2006.01)
    *G01R 19/00*       (2006.01)
(52) U.S. Cl.
    CPC ... *H01F 7/1844* (2013.01); *F02D 2041/2013* (2013.01); *F02D 2041/2055* (2013.01); *F02D 2041/2058* (2013.01); *F02D 2200/063* (2013.01); *H01F 2007/1861* (2013.01)
(58) Field of Classification Search
    CPC ............... F02M 43/04; F02M 2200/50; F02M 2547/006; F02M 2200/16; F02M 2200/46; F02M 2200/90; Y02T 10/36; F02D 19/0694; F02D 41/0027; F02D 41/0025
    See application file for complete search history.

(56) References Cited

U.S. PATENT DOCUMENTS

| | | |
|---|---|---|
| 9,412,508 B2 | 8/2016 | Koch et al. |
| 2013/0139791 A1* | 6/2013 | Kusakabe ............... F02D 41/20 123/478 |
| 2014/0092516 A1 | 4/2014 | Koch et al. .................. 361/160 |
| 2014/0095052 A1* | 4/2014 | Frohlich ................. F02D 41/20 701/103 |

FOREIGN PATENT DOCUMENTS

| | | | | |
|---|---|---|---|---|
| DE | 102010027806 A1 | 10/2011 | ............. | F02D 41/20 |
| DE | 102010063009 A1 | 6/2012 | ............. | F02D 41/34 |
| DE | 102011005672 A1 | 9/2012 | ............. | F02D 41/20 |
| DE | 102011083481 A1 | 12/2012 | ............. | F02D 41/22 |
| JP | 5296120 A | 11/1993 | ............. | F02D 41/20 |
| WO | 2012/123445 A1 | 9/2012 | ............. | F02D 41/20 |
| WO | 2012/167290 A1 | 12/2012 | ............. | F02D 41/22 |
| WO | 2014/177431 A1 | 11/2014 | ............. | F02D 41/20 |

OTHER PUBLICATIONS

International Search Report and Written Opinion, Application No. PCT/EP2014/058181, 18 pages, dated Aug. 18, 2014.
Korean Notice of Allowance, Application No. 2017060534350, 3 pages, dated Aug. 30, 2017.
Chinese Office Action, Application No. 201480024199.X, 5 pages, dated May 5, 2017.
Chinese Office Action, Application No. 201480024199.X, 17 pages, dated Jan. 3, 2018.

* cited by examiner

METHOD AND DEVICE FOR DETERMINING A REFERENCE CURRENT PROGRESSION FOR A FUEL INJECTOR, FOR DETERMINING THE INSTANT OF A PREDETERMINED OPENING STATE OF THE FUEL INJECTOR

CROSS-REFERENCE TO RELATED APPLICATIONS

This application is a U.S. National Stage Application of International Application No. PCT/EP2014/058181 filed Apr. 23, 2014, which designates the United States of America, and claims priority to DE Application No. 10 2013 207 842.0 filed Apr. 29, 2013, the contents of which are hereby incorporated by reference in their entirety.

TECHNICAL FIELD

The present invention relates to the technical field of the drive of fuel injectors. Embodiments of the present invention relate to a method for determining a reference current progression for a fuel injector for an internal-combustion engine of a motor vehicle, which fuel injector has a solenoid drive. Other embodiments relate to a method for determining the instant of a predetermined opening state of a fuel injector having a solenoid drive based on an determined reference current progression. Other embodiments relate to a corresponding device, to an engine management system and also to a computer program for determining the reference current progression and/or for determining the instant of a predetermined opening state of a fuel injector having a solenoid drive.

BACKGROUND

When fuel injectors with solenoid drive are in operation, differing temporal opening and closing behaviors of the individual injectors, and consequently variations in the respective injection quantity, occur by reason of electrical, magnetic, mechanical and hydraulic tolerances.

The relative differences in injection quantity from injector to injector increase when the injection-times become shorter. Hitherto these relative quantitative differences were small and without practical significance. But the trend towards smaller injection quantities and shorter injection-times has the result that the influence of the relative quantitative differences can no longer be disregarded.

The temporal progression of the current intensity during a process for opening the fuel injector (in which a voltage pulse (boost voltage) is applied to the solenoid drive) is dependent on the inductance of the solenoid drive. In addition to the changing self-inductance of the solenoid drive (by reason of the non-linear ferromagnetic magnetic material), there is also a component of motional inductance by reason of the motion of the armature. The component of motional inductance begins with the beginning of the opening phase (armature/needle motion begins), and ends at the end of the opening phase (armature/needle motion ends). If the injector has been fixed, for example by mechanical clamping, in a predetermined position (for example, closed, half-open or entirely open), the current progression will likewise change by virtue of the changed inductive influences. It has turned out that it is possible to determine the instant of a predetermined opening state by analysis of one or more such current progressions (reference current progressions) and also of an determined actual temporal current progression.

The reference current progressions can be determined by measurements performed in a laboratory for a single fuel injector or for a number of fuel injectors. But such laboratory measurements are costly, provide only average values, and also cannot take into consideration changes in the behavior of the fuel injector that are due to use and that occur during the service life of the individual fuel injector.

SUMMARY

One embodiment provides a method for determining a reference current progression for a fuel injector for an internal-combustion engine of a motor vehicle, which fuel injector has a solenoid drive, the method comprising applying a first voltage pulse to the solenoid drive of the fuel injector, so that the fuel injector is opened, applying a holding voltage to the solenoid drive of the fuel injector, in order to keep the fuel injector open, switching off the holding voltage, waiting until such time that substantially no current flows through the solenoid drive for a predetermined period, the predetermined period being so short that the fuel injector remains open, applying a second voltage pulse to the solenoid drive of the fuel injector, and determining the temporal progression of the current intensity of a current that flows through the solenoid drive during the application of the second voltage pulse, the determined temporal progression constituting the reference current progression.

In a further embodiment, the method further includes storing the determined reference current progression.

Another embodiment provides a method for determining the instant of a predetermined opening state of a fuel injector, having a solenoid drive, for an internal-combustion engine of a motor vehicle, the method comprising: determining the temporal progression of the current intensity of a current flowing through the solenoid drive, determining a differential progression based on the determined temporal progression of the current intensity and a reference current progression, wherein the reference current progression was determined by application of the method as claimed in one of the preceding claims, and determining an instant at which the differential progression exhibits an extreme value, the determined instant being the instant of the predetermined opening state.

In a further embodiment, the method further includes determining a further differential progression based on the determined temporal progression of the current intensity and a further reference current progression, the further reference current progression corresponding to the temporal progression of the current intensity of the current flowing through the solenoid drive in a state in which the fuel injector has been fixed in a closed position, and determining a further instant at which the further differential progression exhibits an extreme value and/or at which a predetermined correlation exists between the differential progression and the further differential progression.

In a further embodiment, the determined instant of the predetermined opening state of the fuel injector is a start-instant or end-instant of a process for opening or closing the fuel injector.

Another embodiment provides a method for driving a fuel injector, having a solenoid drive, for an internal-combustion engine of a motor vehicle, the method comprising: determining the instant of a predetermined opening state of the fuel injector by perform any of the methods described above, determining a difference between the determined instant and a reference instant, and driving the fuel injector, wherein a voltage pulse is applied to the solenoid drive, the start-time and/or period of said voltage pulse being established based on the determined difference.

Another embodiment provides a device for determining a reference current progression for a fuel injector for an internal-combustion engine of a motor vehicle, which fuel injector has a solenoid drive, the device comprising an application unit that has been configured to: apply a first voltage pulse to the solenoid drive of the fuel injector, so that the fuel injector is opened, apply a holding voltage to the solenoid drive of the fuel injector, in order to keep the fuel injector open, switch off the holding voltage, wait until such time that substantially no current flows through the solenoid drive for a predetermined period, the predetermined period being so short that the fuel injector remains open, and apply a second voltage pulse to the solenoid drive of the fuel injector; and an current evaluation unit for determining the temporal progression of the current intensity of a current that flows through the solenoid drive during the application of the second voltage pulse, the determined temporal progression constituting the reference current progression.

Another embodiment provides an engine management system for an internal-combustion engine of a motor vehicle, the engine management system having been set up to perform any of the methods described above.

Another embodiment provides a computer program for determining a reference current progression for a fuel injector for an internal-combustion engine of a motor vehicle, which fuel injector has a solenoid drive, the computer program being executable by a processor to perform any of the methods described above.

BRIEF DESCRIPTION OF THE DRAWINGS

Example embodiments are discussed below with reference to the drawings, in which.

DETAILED DESCRIPTION

Figure 1:
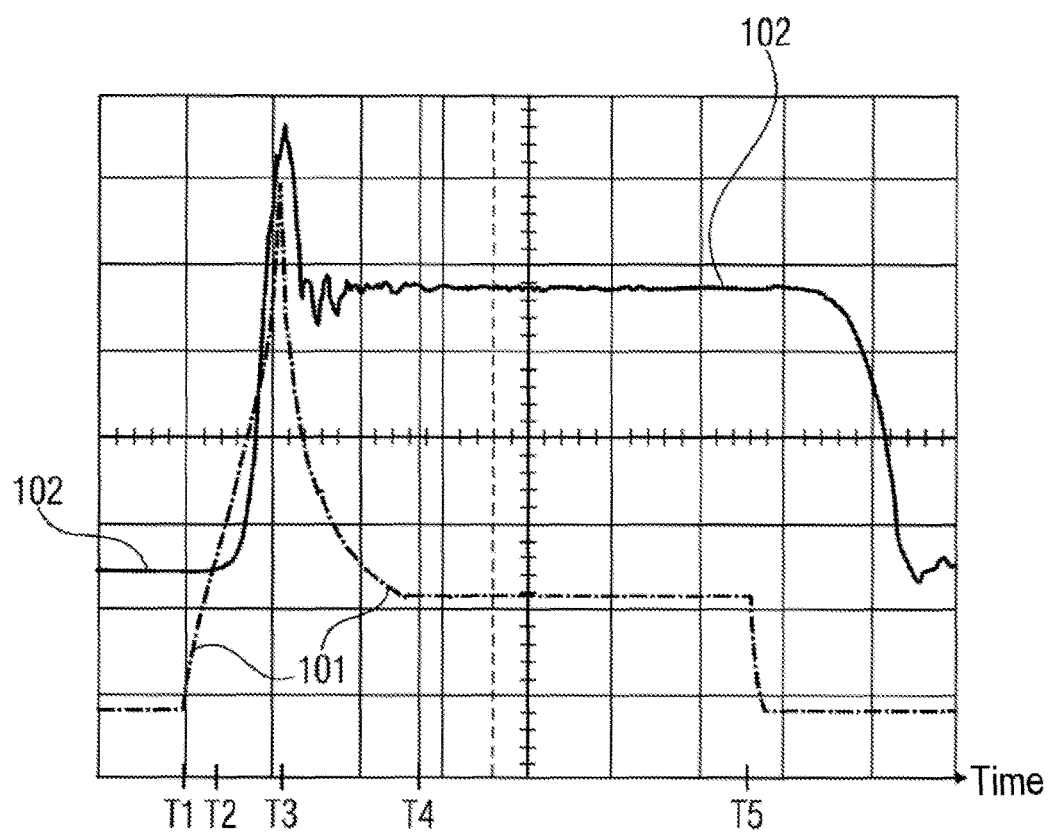
FIG. 1 shows coil current and needle lift for a fuel injector as functions of time during a normal injection process.

Embodiments of the invention provide an improved drive of fuel injectors that can compensate—effectively, simply and precisely—for relative injection-quantity differences due to tolerances.

Some embodiments provide a method for determining a reference current progression for a fuel injector for an internal-combustion engine of a motor vehicle, wherein the fuel injector has a solenoid drive. The described method comprises the following: (a) applying a first voltage pulse to the solenoid drive of the fuel injector, so that the fuel injector is opened, (b) applying a holding voltage to the solenoid drive of the fuel injector, in order to keep the fuel injector open, (c) switching off the holding voltage, (d) waiting until such time that substantially no current flows through the solenoid drive for a predetermined period, the predetermined period being so short that the fuel injector remains open, (e) applying a second voltage pulse to the solenoid drive of the fuel injector, and (f) determining the temporal progression of the current intensity of a current that flows through the solenoid drive during the application of the second voltage pulse, the determined temporal progression constituting the reference current progression.

The finding underlying the described method is that a brief switching-off of the coil current during the holding phase, followed by a renewed application of a voltage pulse (boost voltage) to the solenoid drive, makes it possible to determine a reference current progression that corresponds to the inductive behavior of the solenoid drive in a state in which the injector has been fixed (for example, by mechanical clamping) in an open position. Here it is important that the predetermined period is so short that no hydraulic closing reaction of the injector is caused. In other words, the delayed magnetic force reaction of the injector is utilized in order to supply current to the solenoid drive of the injector in a state in which the fuel injector is open from the start.

In this open state, in which the armature has been positioned in a position with minimum air gap (between armature and abutment face), the current curve (that is to say, the reference current progression) of the fuel injector exhibits a temporal behavior with more intense inductive behavior from the beginning of the supply of current, since the magnetic circuit exhibits smaller magnetic resistances from the start.

Consequently the reference current progression can be determined easily in the course of an injection process.

In this document, (first and second) "voltage pulse" designates, in particular, a so-called boost-voltage pulse which has been set for the purpose of opening the fuel injector quickly.

In this document, "holding voltage" designates, in particular, a substantially constant voltage that is lower than the boost voltage and that has been set for the purpose of keeping the fuel injector open (holding phase) during the injecting of fuel (e.g. on-board battery supply voltage).

The predetermined period may, in particular, be within the range from about 100 μs to 200 μs.

According to one embodiment, the method further includes storing the determined reference current progression.

By virtue of storage of the determined reference current progression, for example in a memory connected to an engine management system, the reference current progression can be accessed at any time.

Other embodiments provide a method for determining the instant of a predetermined opening state of a fuel injector, having a solenoid drive, for an internal-combustion engine of a motor vehicle. The described method comprises the following: (a) determining the temporal progression of the current intensity of a current flowing through the solenoid drive, (b) determining a differential progression based on the determined temporal progression of the current intensity and a reference current progression, wherein the reference current progression was determined by application of the method according to the first aspect or according to one of the above embodiments, and (c) determining an instant at which the differential progression exhibits an extreme value, the determined instant being the instant of the predetermined opening state.

The idea underlying the described method is that the temporal progression of the current intensity during a process for opening the fuel injector (in which a voltage pulse (boost voltage) is applied to the solenoid drive) is dependent on the inductance of the solenoid drive. In addition to the changing self-inductance of the solenoid drive (by reason of the non-linear ferromagnetic magnetic material), there is a component of motional inductance by reason of the motion of the armature. The component of motional inductance begins with the beginning of the opening phase (armature/needle motion begins), and ends at the end of the opening phase (armature/needle motion ends). If the injector has been fixed in an open position, the current progression (reference current progression) will likewise change by virtue of the changed inductive influences. By virtue of the brief switching-off of the coil current and the subsequent renewed application of a (second) voltage pulse to the solenoid drive, the reference current progression can be determined when the fuel injector is being operated. Consequently the instant of a predetermined opening state can be determined very precisely by analysis of the differential progression (the difference between the determined temporal current progression and the reference current progression) based on the present behavior of the individual fuel injector.

In this document, "extreme value" designates, in particular, a local or global extreme value of the differential progression as a function of time.

The determining of the instant at which the differential progression exhibits an extreme value can be undertaken, in particular, by using numerical methods.

By virtue of determining the instants at which the differential progression exhibits an extreme value, the instant of the predetermined opening state of the fuel injector can now be determined. By comparing the determined instant with a predetermined instant—that is to say, an instant at which the predetermined opening state is ideally to be attained—deviations from an ideal opening progression of the fuel injector can be established and, where appropriate, compensated.

According to a further embodiment, the method further includes: (a) determining a further differential progression based on the determined temporal progression of the current intensity and a further reference current progression, the further reference current progression corresponding to the temporal progression of the current intensity of the current flowing through the solenoid drive in a state in which the fuel injector has been fixed in a closed position, and (b) determining a further instant at which the further differential progression exhibits an extreme value and/or at which a predetermined correlation exists between the differential progression and the further differential progression.

In this embodiment, the further reference current progression corresponds to the closed position of the fuel injector. In this state, in which the armature has been positioned in a position with maximum air gap (between armature and abutment face), the current curve (that is to say, the further reference current progression) of the fuel injector exhibits a temporal behavior with slighter inductive behavior, since the magnetic circuit exhibits higher magnetic resistances from the beginning of the normally possible motion of the armature.

In this embodiment, a correlation may exist between the differential progression and the further differential progression, particularly when the two differential progressions exhibit an extreme value at substantially the same instant. For example, such a correlation exists if the two differential progressions exhibit a local or global maximum or minimum at the same instant, or if one of the differential progressions exhibits a maximum and the other differential progression exhibits a minimum at the same instant.

According to a further embodiment, the determined instant of the predetermined opening state of the fuel injector is a start-instant or end-instant of a process for opening or closing the fuel injector.

In this document, "process for opening the fuel injector" designates, in particular, a progression that begins at the instant when the closed fuel injector starts to open on account of the current flowing through the solenoid drive, and ends at the instant when the fuel injector has been fully opened.

In this document, "process for closing the fuel injector" designates, in particular, a progression that begins at the instant at which the open fuel injector begins to close on account of shutdown of the current flowing through the solenoid drive, and ends at the instant when the fuel injector has been entirely closed again.

By determining the start-instant and the end-instant of the opening process and closing process, it can be established whether the opening process or closing process is proceeding as designated. Should this not be the case—for example, on account of deviations due to tolerance in electrical, magnetic, mechanical and hydraulic parameters of the fuel injector—the progression can be compensated, in order to avoid a deviation from the designated injection quantity.

Other embodiments provide a method for driving a fuel injector, having a solenoid drive, for an internal-combustion engine of a motor vehicle. The described method comprises the following: (a) determining the instant of a predetermined opening state of the fuel injector by application of the method according to the second aspect or according to one of the above embodiments, (b) determining a difference between the determined instant and a reference instant, and (c) driving the fuel injector, wherein a voltage pulse is applied to the solenoid drive, the start-time and/or period of said voltage pulse being established based on the determined difference.

The idea underlying the described method is that the driving of the fuel injector can be adapted based on the determined difference between the determined instant and a reference instant in such a manner that deviations in the injection quantity can be minimized.

In this document, "reference instant" designates, in particular, an instant at which the predetermined opening state of the fuel injector is to happen in the ideal case. The determined difference between the determined instant and the reference instant accordingly constitutes a measure of how much the instant of the actual happening of the predetermined opening state deviates from the ideal or desired instant.

If, for example, it is established that the start of the opening process has been temporally shifted, the start-time of the voltage pulse that is applied to the solenoid drive can be shifted correspondingly.

If, for example, it is established that the end of the opening process has been temporally shifted, the injection period can be adapted in order to ensure that the designated quantity of fuel is injected. In other words, the period of the voltage pulse can be lengthened in the case of a delayed opening of the fuel injector, in order to prevent too little fuel from being injected.

Similarly, the period of the voltage pulse can be shortened in the case of a premature opening of the fuel injector, in order to prevent too much fuel from being injected.

The aforementioned corrections can advantageously be performed for each individual pulse—that is to say, for each individual opening process.

The corrections or time-shifts may, moreover, take into consideration physical system parameters such as, for example, fuel temperature, solenoid temperature, interval from the previous injection process, etc. This can be undertaken, for example, by using appropriate pilot characteristics or pilot fields or by using a model.

Since the determined instant is based on an up-to-date reference current progression for the specific fuel injector, a very precise adaptation of the injection quantity can be obtained.

Other embodiments provide a device for determining a reference current progression for a fuel injector for an internal-combustion engine of a motor vehicle, which fuel injector has a solenoid drive. The described device comprises the following: (a) an application unit that has been configured to: (aa) apply a first voltage pulse to the solenoid drive of the fuel injector, so that the fuel injector is opened, (ab) apply a holding voltage to the solenoid drive of the fuel injector, in order to keep the fuel injector open, (ac) switch off the holding voltage, (ad) wait until such time that substantially no current flows through the solenoid drive for a predetermined period, the predetermined period being so short that the fuel injector remains open, and (ae) apply a second voltage pulse to the solenoid drive of the fuel injector; and (b) an current evaluation unit for determining the temporal progression of the current intensity of a current that flows through the solenoid drive during the application of the second voltage pulse, the determined temporal progression constituting the reference current progression.

The same findings that were described above in connection with the first and second aspects underlie the described device.

The application unit may, in particular, have been set up to generate voltage pulses that typically exhibit an elevated boost voltage in comparison with a vehicle-battery voltage, and also to generate a lower holding voltage in order to drive the solenoid drive of the fuel injector.

The current evaluation unit may, in particular, have an FADC (fast analog-to-digital converter) that is suitable for determining the coil current of the fuel injector being operated in the given case.

The described device can consequently determine a reference current progression during the operation of a fuel injector. This can advantageously be undertaken at regular intervals, for example monthly or half-yearly, in conjunction with vehicle maintenance in a workshop, or in accordance with the mileage of the vehicle.

Other embodiments provide an engine management system for a vehicle. The described engine management system has been set up to perform the methods according to the first or second aspect or according to one of the above embodiments.

This engine management system makes it possible, by simple and inexpensive means, to minimize variations in the injection quantity in the case of several fuel injectors.

Other embodiments provide a computer program for determining the instant of a predetermined opening state of a fuel injector, having a solenoid drive, for an internal-combustion engine of a motor vehicle. The described computer program has been set up to perform the methods according to the first or second aspect or according to one of the above embodiments when it is executed by a microcontroller.

Within the meaning of this document, the mention of such a computer program is equivalent to the concept of a program element, a computer-program product and/or a computer-readable medium that contains instructions for controlling a computer system in order to coordinate the mode of operation of a system or of a method suitably in order to obtain the effects associated with the disclosed method.

The computer program may have been implemented as computer-readable instruction code in any suitable programming language such as, for example, Java, C++ etc. The computer program may have been stored on a computer-readable storage medium (CD-ROM, DVD, Blu-ray Disk, interchangeable drive assembly, volatile or non-volatile memory, built-in memory/processor, etc.). The instruction code can program a computer or other programmable appliances—such as, in particular, a control unit for an engine of a motor vehicle—in such a manner that the desired functions are performed. Furthermore, the computer program can be made available in a network—such as, for example, the Internet—from which it can be downloaded by a user as needed.

Embodiments of the invention can be realized both by means of a computer program, i.e. software, and by means of one or more special electric circuits, i.e. in hardware, or in arbitrarily hybrid form, i.e. by means of software components and hardware components.

Attention is drawn to the fact that embodiments of the invention have been described with reference to varying subject-matters of the invention. In particular, some embodiments of the invention have been described with method claims, and other embodiments of the invention with device claims. To a person skilled in the art, however, it will immediately become clear upon reading this application that, unless explicitly stated otherwise, in addition to a combination of features that appertain to one type of subject-matter of the invention, an arbitrary combination of features that appertain to varying types of subject-matter of the invention is also possible.

A Determination

FIG. 1 shows coil current 101 and needle lift 102 for a fuel injector as functions of time during a normal injection process.

At the start of the injection process (at instant T1), a voltage pulse (boost voltage) is applied to the solenoid drive of the fuel injector. This voltage pulse causes the coil current 101 to start to rise. If, after a short time (at instant T2), the coil current 101 attains a certain value, the needle lift 102 starts to rise, inasmuch as the motion of the injector needle in the direction of the open position is initiated. At instant T3 the voltage that is applied to the solenoid drive is reduced to a lower value (holding voltage). This has the result that the coil current 101 is reduced again until at instant T4 it attains a stable value. At this instant the needle lift 102 has also stabilized after a transient phase, and the fuel injector is now in its open state. The injection phase is then concluded by virtue of the fact that the holding voltage is switched off at instant T5, so that the coil current drops again and attains its lowest value (substantially 0 A). The needle lift then also drops with a certain delay until the fuel injector has been closed again.

Figure 2:
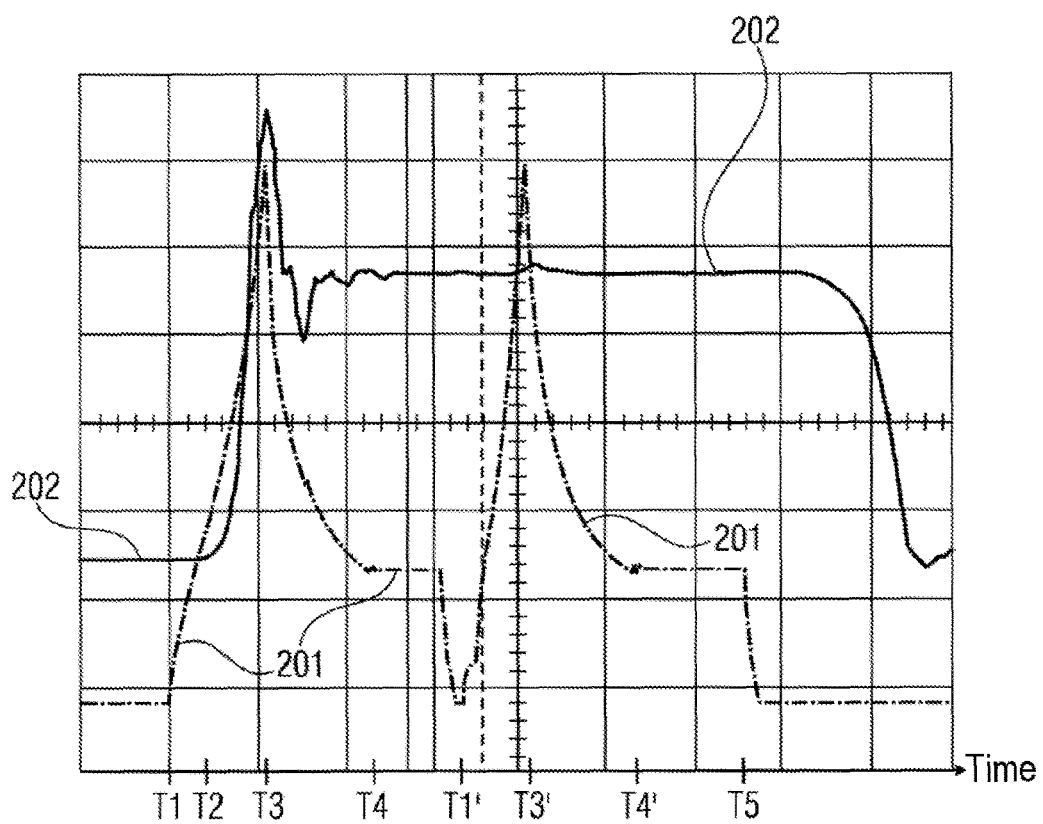
FIG. 2 shows coil current and needle lift for a fuel injector as functions of time during a determination, according to one embodiment, of a reference current progression.

FIG. 2 shows coil current 201 and needle lift 202 for a fuel injector as functions of time during a determination, according to one embodiment, of a reference current progression. Up until instant T4 the progression of the coil current 201 and needle lift 202 shown in FIG. 2 is the same as or very similar to the progression shown in FIG. 1. The progression up until instant T4 will consequently not be repeated at this point.

Unlike in FIG. 1, in which the coil current is held at a substantially constant value (corresponding to the holding voltage) during the injection phase up until the initiating of the closing process, the holding voltage is briefly switched off, so that the coil current 201 drops to about 0 A. Very shortly after this, a boost-voltage pulse is again applied to the solenoid drive at instant T1', so that the coil current 201 rises again. The time during which the coil current is 0 A is so short (about 50-100 µs) that the needle lift 202 remains unchanged, and consequently fuel is injected continuously during the pause in the supply of current. The rising progression of the coil current 201 as from T1' is measured and stored as reference current progression (by means of measuring devices and storage devices which are not represented). At instant T3' the holding voltage is again applied to the solenoid drive, and at instant T4' the coil current again attains the stable value corresponding to the holding voltage. From this instant, the progression again corresponds to the progression represented in FIG. 1.

As a result of this modified activation of the solenoid drive of the fuel injector, and simultaneous measurement of the temporal progression of the coil current during the renewed (second) application of the boost voltage to the solenoid drive, a reference current progression can be easily determined "online", without the injection of fuel being influenced. This reference current progression corresponds to the progression of the coil current, which can be measured in the laboratory, if the fuel injector has been fixed in its open position. By regular repetition of the method described above in connection with FIG. 2, it can be ensured, other than by laboratory measurements, that the reference current progression is constantly up to date. Hence the start-instant and termination-instant can be determined very precisely, for example by analysis of the difference between the actual coil-current progression and the reference current progression, and necessary corrections can be performed where appropriate.

What is claimed is:

1. A method for determining a reference current progression for a fuel injector for an internal-combustion engine of a motor vehicle, which fuel injector has a solenoid drive, the method comprising:
    applying a first voltage pulse to the solenoid drive of the fuel injector to open the fuel injector,
    applying a holding voltage to the solenoid drive of the fuel injector to maintain the fuel injector open,
    switching off the holding voltage,
    keeping the holding voltage switched off to affect a currentless period having a predetermined duration during which substantially no current flows through the solenoid drive, wherein the predetermined duration is sufficiently short such that the fuel injector remains open during the currentless period,
    ending the currentless period by applying a second voltage pulse to the solenoid drive of the fuel injector,
    determining a temporal progression of a current intensity of a current that flows through the solenoid drive during the application of the second voltage pulse, the determined temporal progression constituting the reference current progression,
    determining an instant of a predetermined opening state of the fuel injector based on the determined reference current progression,
    determining a second temporal progression of a current intensity of a current flowing through the solenoid drive,
    determining a differential progression based on the determined second temporal progression of the current intensity and the determined reference current progression, and
    determining an instant at which the differential progression exhibits a predefined extreme value, wherein the determined instant corresponds to the instant of the predetermined opening state.

2. The method of claim 1, further including storing the determined reference current progression.

3. A method for determining and instant of a predetermined opening state of a fuel injector having a solenoid drive, in an internal-combustion engine of a motor vehicle, the method comprising:
    determining a reference current progression by:
        applying a first voltage pulse to the solenoid drive of the fuel injector to open the fuel injector,
        applying a holding voltage to the solenoid drive of the fuel injector to maintain the fuel injector open,
        switching off the holding voltage,
        keeping the holding voltage switched off to effect a currentless period having a predetermined duration during which substantially no current flows through the solenoid drive, wherein the predetermined duration is sufficiently short such that the fuel injector remains open during the currentless period,
        ending the currentless period by applying a second voltage pulse to the solenoid drive of the fuel injector, and
        determining a first temporal progression of a current intensity of a current that flows through the solenoid drive during the application of the second voltage pulse, the determined first temporal progression constituting the reference current progression,
    determining a second temporal progression of a current intensity of a current flowing through the solenoid drive,
    determining a differential progression based on the determined second temporal progression of the current intensity and the determined reference current progression, and
    determining an instant at which the differential progression exhibits a predefined extreme value, wherein the determined instant corresponds to the instant of the predetermined opening state.

4. The method of claim 3, further comprising:
    determining a further differential progression based on the determined temporal progression of the current intensity and a further reference current progression, the further reference current progression corresponding to a temporal progression of the current intensity of the current flowing through the solenoid drive in a closed state of the fuel injector, and
    determining a further instant at which the further differential progression exhibits a predefined extreme value or at which a predetermined correlation exists between the differential progression and the further differential progression.

5. The method of claim 4, wherein the determined instant of the predetermined opening state of the fuel injector is a start-instant or end-instant of a process for opening or closing the fuel injector.

6. A method for driving a fuel injector having a solenoid drive, in an internal-combustion engine of a motor vehicle, the method comprising:
    determining an instant of a predetermined opening state of the fuel injector by:
        determining a reference current progression by:
            applying a first voltage pulse to the solenoid drive of the fuel injector to open the fuel injector,
            applying a holding voltage to the solenoid drive of the fuel injector to maintain the fuel injector open,
            switching off the holding voltage, keeping the holding voltage switched off to effect a currentless period having a predetermined duration during which substantially no current flows through the solenoid drive, wherein the predetermined duration is sufficiently short such that the fuel injector remains open during the currentless period, ending the currentless period by applying a second voltage pulse to the solenoid drive of the fuel injector, and determining a first temporal progression of a current intensity of a current that flows through the solenoid drive during the application of the second voltage pulse, the determined first temporal progression constituting the reference current progression, determining a second temporal progression of a current intensity of a current flowing through the solenoid drive, determining a differential progression based on the determined second temporal progression of the current intensity and the determined reference current progression, and determining an instant at which the differential progression exhibits a predefined extreme value, wherein the determined instant corresponds to the instant of the predetermined opening state, determining a difference between the determined instant and a reference instant, and driving the fuel injector based on the determined difference by controlling a timing of a voltage pulse applied to the solenoid drive based on the determined difference.

7. A device for determining a reference current progression for a fuel injector for an internal-combustion engine of a motor vehicle, which fuel injector has a solenoid drive, the device comprising:

an application unit programmed to:
apply a first voltage pulse to the solenoid drive of the fuel injector to open the fuel injector,
apply a holding voltage to the solenoid drive of the fuel injector to maintain the fuel injector open,
switch off the holding voltage,
keep the holding voltage switched off to effect a currentless period having a predetermined duration during which substantially no current flows through the solenoid drive, wherein the predetermined duration is sufficiently short such that the fuel injector remains open during the currentless period, and
end the currentless period by applying a second voltage pulse to the solenoid drive of the fuel injector; and a current evaluation unit programmed to:
determine a temporal progression of the current intensity of a current that flows through the solenoid drive during the application of the second voltage pulse, the determined temporal progression constituting the reference current progression, determine an instant of a predetermined opening state of the fuel injector based on the determined reference current progression, determining a second temporal progression of a current intensity of a current flowing through the solenoid drive, determining a differential progression based on the determined second temporal progression of the current intensity and the determined reference current progression, and determining an instant at which the differential progression exhibits a predefined extreme value, wherein the determined instant corresponds to the instant of the predetermined opening state.

8. The device of claim 7, further including a storage device that stores the determined reference current progression.

9. The device of claim 7, wherein the current evaluation unit is further configured to:
determine a second temporal progression of a current intensity of a current flowing through the solenoid drive,
determine a differential progression based on the determined second temporal progression of the current intensity and the determined reference current progression, and
determine an instant at which the differential progression exhibits a predefined extreme value, wherein the determined instant corresponds to the instant of the predetermined opening state.

10. The device of claim 9, wherein the current evaluation unit is further configured to:
determine a further differential progression based on the determined temporal progression of the current intensity and a further reference current progression, the further reference current progression corresponding to a temporal progression of the current intensity of the current flowing through the solenoid drive in a closed state of the fuel injector, and
determine a further instant at which the further differential progression exhibits a predefined extreme value or at which a predetermined correlation exists between the differential progression and the further differential progression.

11. The device of claim 10, wherein the determined instant of the predetermined opening state of the fuel injector is a start-instant or end-instant of a process for opening or closing the fuel injector.

12. The device of claim 10, wherein:
the current evaluation unit is further configured to determine a difference between the determined instant and a reference instant, and
the device comprises a fuel injector controller configured to drive the fuel injector based on the determined difference by controlling a timing of a voltage pulse applied to the solenoid drive based on the determined difference.

* * * * *